(12) United States Patent
Lee et al.

(10) Patent No.: US 7,682,888 B2
(45) Date of Patent: Mar. 23, 2010

(54) METHODS OF FORMING NMOS/PMOS TRANSISTORS WITH SOURCE/DRAINS INCLUDING STRAINED MATERIALS

(75) Inventors: Ho Lee, Gyeonggi-do (KR); Tetsuji Ueno, Gyeonggi-do (KR); Hwa-Sung Rhe, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 436 days.

(21) Appl. No.: 11/435,968

(22) Filed: May 17, 2006

(65) Prior Publication Data

US 2007/0048907 A1    Mar. 1, 2007

(30) Foreign Application Priority Data

Aug. 24, 2005    (KR) .................. 10-2005-0077916

(51) Int. Cl.
H01L 21/4763    (2006.01)

(52) U.S. Cl. ............... 438/184; 438/199; 257/E21.337; 257/E21.395; 257/E21.427; 257/E21.632; 257/E21.633; 257/E27.066; 257/E29.004; 257/E29.051; 257/E29.054; 257/E29.063

(58) Field of Classification Search ............... 438/150, 438/168, 187, 198, 184, 195; 257/E21.337, 257/395, 427, 433, 632, 633, E27.066, E29.004, 257/E29.051, E29.054, E29.063

See application file for complete search history.

(56) References Cited

U.S. PATENT DOCUMENTS

| 5,317,175 | A  | * | 5/1994  | Throngnumchai ......... 257/255 |
| 5,729,045 | A  | * | 3/1998  | Buynoski .................... 257/627 |
| 5,972,783 | A  | * | 10/1999 | Arai et al. .................... 438/513 |
| 6,342,436 | B1 | * | 1/2002  | Takizawa ..................... 438/473 |
| 6,621,131 | B2 |   | 9/2003  | Murthy et al. .............. 257/408 |
| 6,690,060 | B2 | * | 2/2004  | Horiuchi et al. ............. 257/327 |
| 6,861,318 | B2 |   | 3/2005  | Murthy et al. .............. 438/299 |
| 6,878,976 | B2 | * | 4/2005  | Coolbaugh et al. .......... 257/183 |
| 6,885,084 | B2 |   | 4/2005  | Murthy et al. .............. 257/622 |
| 6,906,393 | B2 | * | 6/2005  | Sayama et al. .............. 257/414 |
| 6,921,913 | B2 |   | 7/2005  | Yeo et al. |
| 7,494,902 | B2 | * | 2/2009  | Jurczak et al. .............. 438/479 |
| 2003/0025131 | A1 | * | 2/2003 | Lee et al. .................... 257/200 |
| 2004/0253776 | A1 |   | 12/2004 | Hoffmann et al. |
| 2005/0224798 | A1 | * | 10/2005 | Buss .......................... 257/65 |
| 2006/0084207 | A1 | * | 4/2006 | White et al. ................. 438/184 |
| 2006/0118880 | A1 | * | 6/2006 | Komoda ..................... 257/369 |
| 2006/0234455 | A1 | * | 10/2006 | Chen et al. .................. 438/276 |

(Continued)

OTHER PUBLICATIONS

Komoda et al.; *Mobility Improvement for 45nm Node by Combination of Optimized Stress Control and Channel Orientation Design*; Electron Devices Meeting, 2004; IEDM Technical Digest; IEEE International, pp. 217-220 Dec. 13-15, 2004.

(Continued)

*Primary Examiner*—Michael S Lebentritt
(74) *Attorney, Agent, or Firm*—Myers Bigel Sibley & Sajovec, P.A.

(57) ABSTRACT

A method of forming an integrated circuit includes selectively forming active channel regions for NMOS and PMOS transistors on a substrate parallel to a <100> crystal orientation thereof and selectively forming source/drain regions of the NMOS transistors with Carbon (C) impurities therein.

26 Claims, 11 Drawing Sheets

U.S. PATENT DOCUMENTS

2007/0262385 A1* 11/2007 Nguyen et al. .............. 257/351
2009/0075442 A1* 3/2009 Ke et al. ..................... 438/199

OTHER PUBLICATIONS

S. Pidin et al.; *A Novel Strain Enhanced CMOS Architecture Using Selectively Deposited High Tensile and High Compressive Silicon Nitride Films*; Proc. IEDM Technical Digest; IEEE, pp. 213-216 (2004).

Translation of a Preliminary Notice of First Office Action as issued by the Taiwan Intellectual Property Office, Application No. 095131113, Apr. 15, 2009.

* cited by examiner

METHODS OF FORMING NMOS/PMOS TRANSISTORS WITH SOURCE/DRAINS INCLUDING STRAINED MATERIALS

CROSS-REFERENCE TO RELATED APPLICATION

This application claims the benefit of Korean Patent Application No. 10-2005-0077916, filed on Aug. 24, 2005, in the Korean Intellectual Property Office, the disclosure of which is incorporated herein in its entirety by reference.

FIELD OF THE INVENTION

The present invention relates to methods of forming structures in integrated circuits, and more particularly, to methods of forming NMOS/PMOS transistor structures in integrated circuits.

BACKGROUND

Research is ongoing in the area of complementary metal oxide semiconductor (CMOS) structures in the area of carrier mobility improvement. Some of the areas investigated for such improvements include the use of high-K gate dielectric materials with metal gate electrodes, the use of FinFET CMOS transistor structures, and the formation of strained materials in the channel of CMOS transistor and the use of liners to induce stress.

One approach to improving carrier mobility in CMOS structures, as discussed in, for example, Komoda et al.; "Mobility Improvement for 45 nm Node by Combination of Optimized Stress Control and Channel Orientation Design," Electron Devices Meeting, 2004. IEDM Technical Digest. IEEE International 13-15 Dec. 2004 Page(s): 217-220, includes the use of silicon germanium, channel orientation and, liner layers.

Various of the approaches listed above are also discussed in, for example, Pidin et al.; "A Novel Strain Enhanced CMOS Architecture Using Selectively High Tensile and High Compressive Silicon Nitride Films," Proc. IEDM 213-216 (2004) and in U.S. Pat. Nos. 6,885,084; 6,621,131; and 6,861,318.

SUMMARY

Embodiments according to the invention can provide methods of forming NMOS/PMOS transistors with source/drains including strained materials and devices so formed. Pursuant to these embodiments, a method of forming an integrated circuit includes selectively forming active channel regions for NMOS and PMOS transistors on a substrate parallel to a <100> crystal orientation thereof and selectively forming source/drain regions of the NMOS transistors with Carbon (C) impurities therein. In some embodiments according to the invention, the method further includes forming a tensile layer on the NMOS transistors to provide tensile strain in the active regions thereof.

In some embodiments according to the invention, forming a tensile layer includes forming a SiN layer on the NMOS transistors so that a ratio of N—H bonding to Si—H bonding in the SiN layer is about 1 to 5. In some embodiments according to the invention, forming a SiN layer includes forming the SiN layer to a thickness of about 50 Angstroms to about 2000 Angstroms using SiH4 gas provided at a rate of about 10 to about 100 sccm with NH3 gas provided at a rate of about 1 to about 5 slm at a power of about 50 to about 1000 W and a temperature of about 400 degrees Centigrade to about 500 degrees Centigrade.

In some embodiments according to the invention, selectively forming source/drain regions includes epitaxially growing C doped silicon in the source/drain regions to provide source/drain regions for the NMOS transistors to substitute C atoms for about 1% to about 2% of the Si atoms in the source/drain regions. In some embodiments according to the invention, selectively forming source/drain regions includes implanting the source/drain regions of the NMOS transistors with C.

In some embodiments according to the invention, epitaxially growing includes epitaxially growing the Carbon doped silicon in the source/drain regions using a CVD process at a temperature less than about 650 degrees Centigrade. In some embodiments according to the invention, epitaxially growing the C doped silicon includes epitaxially growing the C doped silicon in the source/drain regions using an RPCVD or UHVCVD process.

In some embodiments according to the invention, epitaxially growing the C doped silicon in the source/drain regions using an RPCVD process includes providing a Silicon gas at about 100 to about 200 sccm with C gas at about 5 to about 50 sccm with a selective etching gas at less than about 1000 sccm at a pressure of about 10 to about 20 Torr. In some embodiments according to the invention, selectively forming source/drain regions of the NMOS transistors with C impurities therein further includes forming only the source/drain regions of the NMOS transistors with the carbon impurities therein.

In some embodiments according to the invention, the method further includes forming the source/drain regions of the PMOS transistors with Germanium (Ge) impurities therein. In some embodiments according to the invention, forming a tensile layer on the NMOS transistors further includes forming the tensile layer only on the NMOS transistors and avoiding forming the tensile layer on the PMOS transistors.

In some embodiments according to the invention, forming a tensile layer on the NMOS transistors comprises forming the tensile layer only on the NMOS transistors comprises, where the method further includes forming a compressive strain layer only on the PMOS transistors. In some embodiments according to the invention, forming a compressive strain layer further includes neutralizing strain associated with the tensile layer on the PMOS transistors.

In some embodiments according to the invention, a CMOS integrated circuit includes active channel regions for NMOS and PMOS transistors on a substrate parallel to a <100> crystal orientation thereof and source/drain regions of the NMOS transistors with Carbon (C) impurities therein.

In some embodiments according to the invention, the circuit further includes a tensile layer on the NMOS transistors to provide tensile strain in the active regions thereof. In some embodiments according to the invention, the tensile layer is a SiN layer on the NMOS transistors wherein a ratio of N—H bonding to Si—H bonding in the SiN layer is about 1 to 5. In some embodiments according to the invention, the SiN layer has a thickness of about 50 Angstroms to about 2000 Angstroms.

In some embodiments according to the invention, the source/drain regions are C doped epi-silicon, wherein the C atoms are substituted for about 1% to about 2% of the Si atoms in the source/drain regions. In some embodiments according to the invention, the circuit further includes source/drain regions of the PMOS transistors including Germanium (Ge) impurities therein.

In some embodiments according to the invention, the tensile layer is only on the NMOS transistors. In some embodiments according to the invention, the circuit further includes a compressive strain layer only on the PMOS transistors.

Figure 1:
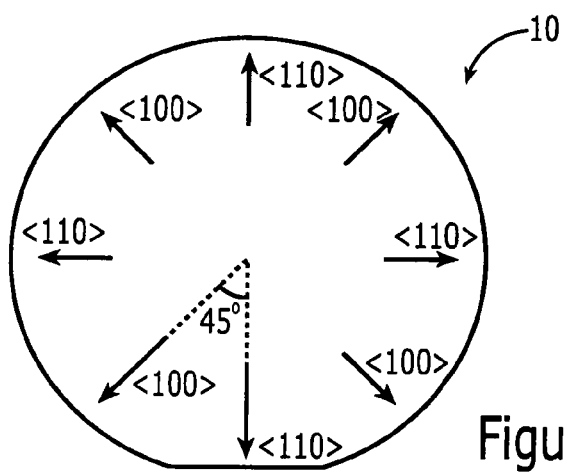
FIG. 1 is a schematic representation of a wafer showing various plane orientations therein.
Figure 2:
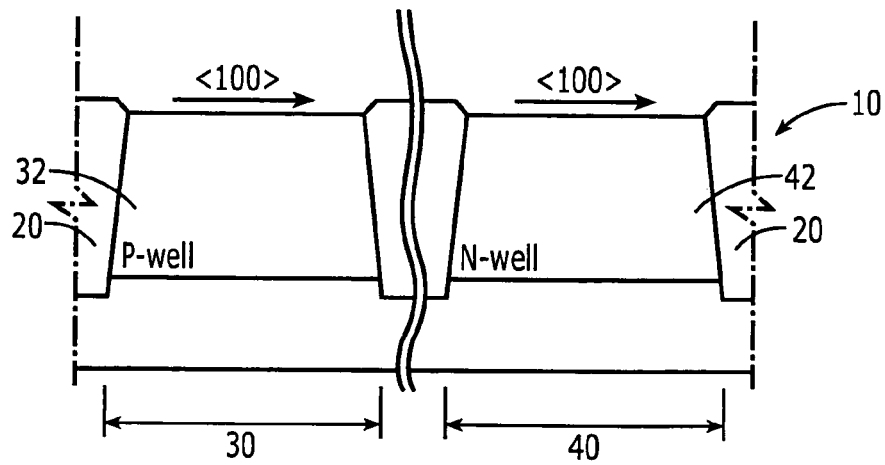
FIGS. 2-12 are cross sectional views that illustrate methods of forming NMOS/PMOS transistors according to some embodiments of the invention.

DESCRIPTION OF EMBODIMENTS
ACCORDING TO THE INVENTION

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As described hereinbelow in greater detail, various approaches can be used in the formation of NMOS/PMOS transistors to promote the overall mobility of carriers therein. For example, in some embodiments according to the invention, PMOS and NMOS transistors are formed on a wafer so that active are to be used as channels are aligned to the <100> plane of the wafer, which can improve the drive current of the PMOS transistor by about 10% to about 20%. Furthermore, carbon doped epi-layers can be used for the source/drains of the NMOS and PMOS transistors to allow an improvement in the drive current of the NMOS transistors by about 20% to about 30%, while also reducing the drive current of the PMOS transistors by about 1% to about 2%. Furthermore, a tensile layer can be formed on the NMOS and PMOS transistors to further improve the drive current of the NMOS transistor, while also reducing the drive current of the PMOS transistors. Therefore, as appreciated by the present inventors, the elements described above in the formation of NMOS and PMOS transistors can be combined for an overall drive current improvement by providing significant improvements in the performance of PMOS transistors (by the use of the <100> channel orientation) as well as the improvement of the drive current in the NMOS transistors by inclusion of the carbon doped epi-layers in the source/drain regions. Moreover, the negative impact of the carbon doped epi-source/drain regions and the tensile layer on the PMOS transistors can be small relative to the improvements for the NMOS transistors provided by the channel orientation and the carbon doped epi-source drain regions, thereby providing an overall improvement in carrier mobility for devices including NMOS and PMOS transistors.

In other embodiments according to the invention, the source/drain regions of the NMOS/PMOS transistors are implanted with carbon rather than growing carbon doped epi-layers in the source/drain regions. In other embodiments according to the invention, a tensile layer is formed only over the NMOS transistor.

In other embodiments according to the invention, the carbon doped epitaxial layer is formed only in source/drain regions associated with NMOS transistors. In still other embodiments according to the invention, carbon doped epi-layers are grown in the source/drain regions associated with the NMOS transistors, whereas geranium doped epitaxial layers are grown in source/drain regions associated with the PMOS transistors. As appreciated by the present inventors, the inclusion of the germanium in the source/drain regions associated with the NMOS transistors can replace a portion of the silicon atoms otherwise present in that structure and thereby generate tensile stress in the associated channel of the PMOS transistor to improve the drive current thereof. In yet other embodiments according to the invention, a compressive layer is formed over the PMOS transistors.

FIGS. 2-11 are cross sectional views that illustrate methods of forming NMOS/PMOS transistors according to some embodiments of the invention. According to FIG. 2, shallow trench isolation regions 20 are formed in different areas of the substrate 30, 40 used to form NMOS and PMOS transistors, respectively. More specifically, the NMOS and PMOS transistors can be formed in the NMOS area 30 and PMOS area 40 having their respective channels aligned to the <100> plane of the wafer as illustrated in FIG. 1. The NMOS region 30 is treated to form a P-well in an NMOS active region 32 thereof. Similarly, an N-well is formed in the PMOS region 40 to provide a PMOS active region 42 therein. Both active areas are formed having an orientation parallel to the <100> plane of the wafer 10.

Figure 3:
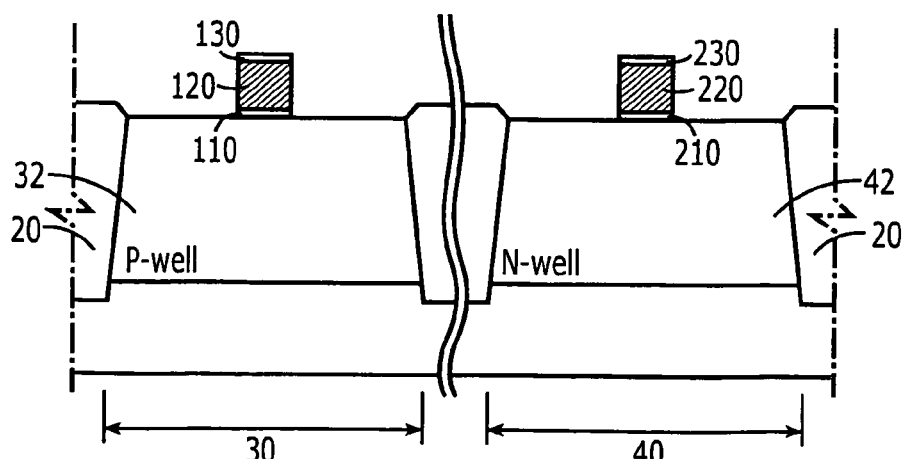

According to FIG. 3, an NMOS gate structure is formed in the NMOS region 30 and a PMOS gate structure is formed in the PMOS region 40. In particular, the NMOS gate structure includes a gate dielectric layer 110 that can be formed of SiO2, SiON, Si3N4, HFO2, ZRO2, AL2O3, TA2O5 or other similar materials. The NMOS gate structures also includes a gate electrode 120, which can be formed of polysilicon or other suitable material. The NMOS gate structure also includes a capping layer 130 on the gate electrode 120, which can be formed from SiN, SiON, or other similar material. The PMOS gate structure includes a gate dielectric layer 210, a gate electrode 220, and a capping layer 230, all of which may be formed from the same materials (or similar materials) as those described above in reference to the gate structure in the NMOS region 30.

Figure 4:
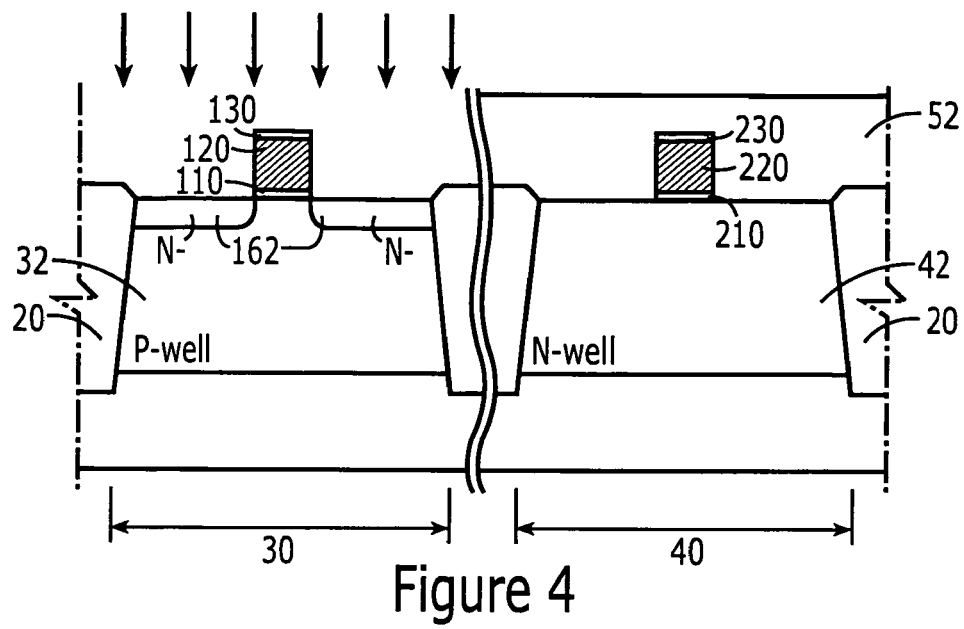

According to FIG. 4, a first mask layer 52 is formed to cover the PMOS region 40 and to expose the NMOS region 30. Impurities are implanted into the NMOS region 30, using the NMOS gate structure as an implant mask, to form N-type lightly doped regions 162. It will be understood that the impurities implanted into the NMOS region 30 can include arsenic or other suitable dopants used to form N-type regions. The first mask layer 52 may then be removed from the PMOS region 40.

Figure 5:
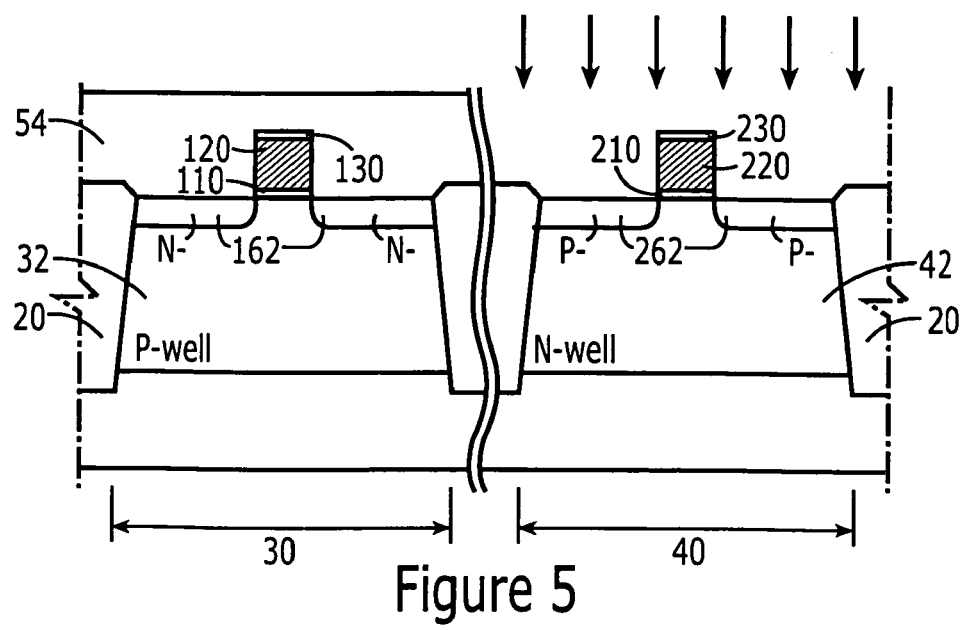

According to FIG. 5, a second mask layer 54 is formed to cover the NMOS region 30 and to expose the PMOS region 40. An implantation is performed in the PMOS region 40 to form P-type lightly doped regions 262 using the PMOS gate structure as a mask. It will be understood that boron or other P-type dopants may be used.

Figure 6:
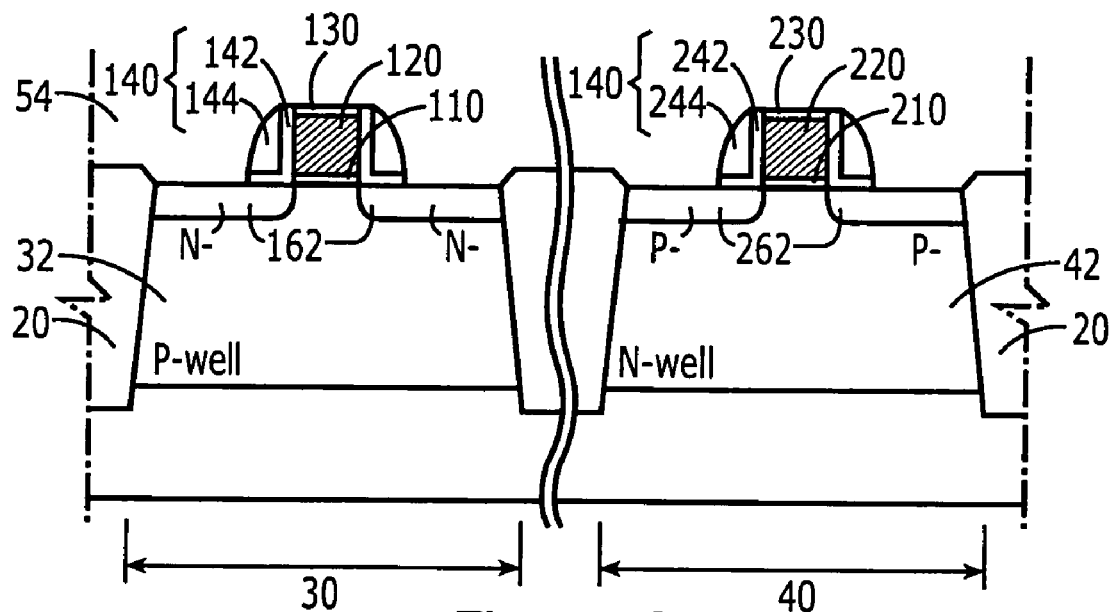

According to FIG. 6, an oxide layer 142 is deposited on the NMOS region 30 and on the PMOS region 40 followed by a nitride layer 144 thereon. An etch back process can be used to form a spacer 140 on the NMOS gate structure including the oxide layer 142 and the nitride layer 144 on the sidewall thereof. Furthermore, the etch back process also forms a sidewall spacer 240 including the oxide layer 242 and nitride layer 244 on a sidewall of the PMOS gate structure.

Figure 7:
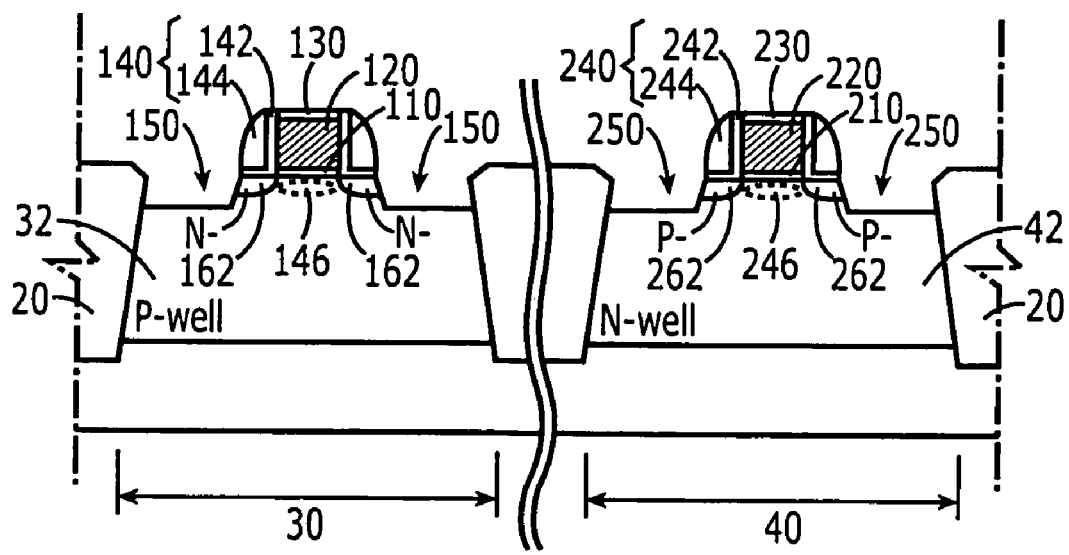

According to FIG. 7, trenches 150 and 250 are formed in the NMOS region and PMOS region 40, respectively, by selectively etching the exposed active regions 32, 42 thereof. In some embodiments according to the invention, the trenches 150 and 250 have a depth of about 300 Angstroms to about 1000 Angstroms. In some embodiments according to the invention, the trenches 150 and 250 can be formed using a dry or chemical vapor etching process. The chemical vapor etching process can include providing HCl at approximately 0.02 to about 1.0 standard liters per minute (SLM) with H/2 at about 20 SLM at a pressure of about 5 Torr to about 700 Torr and a temperature of about 600° C. to about 800° C.

Figure 8:
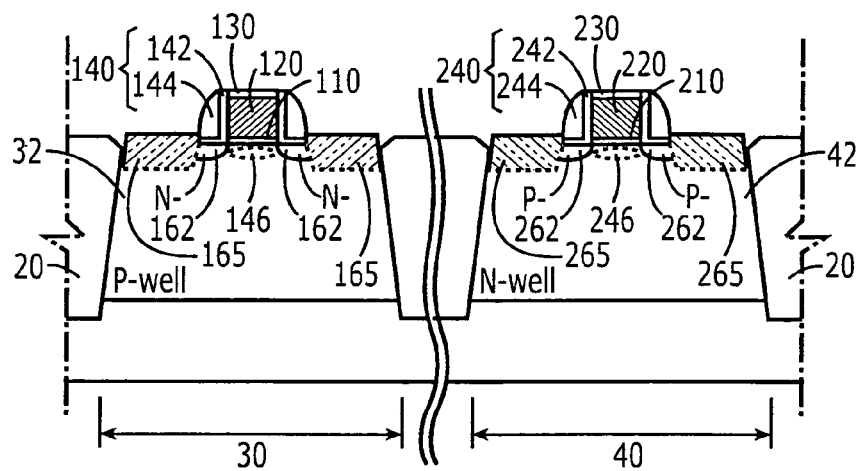

According to FIG. 8, the trenches 150, 250 are filled with carbon doped epitaxial layers using selective epitaxial growth techniques. For example, the carbon doped epitaxial layers can be formed using CVD, reduced pressure CVD (RPCVD) or ultra high vacuum CVD (UHVCVD). In some embodiments according to the invention, the carbon doped epitaxial layers are formed by providing a silicon source gas, a carbon source gas and a selective etching gas at the same time. For example, the silicon gas can be dichlorosilane (DCS), trichlorosiline (TCS), hexachlorosilane (HCS), SIH4 or SI2H6. The carbon gas can be SIH3CH3, CH4, or C2H4. The selective etching gas can be HCL or CL2. Alternative gases to the ones described above can also be used.

The RPCVD process can be carried out using DCS provided at a rate of about 100 to about 200 standard centimeter cube per minute (sccm) with SIH3CH3 provided at about 5 to about 50 sccm with HCL provided at less than about 1000 sccm and carried out at a pressure of about 10 to about 20 Torr at a temperature of no greater than 650° C. As appreciated by the present inventors, if the process of epitaxial growth is carried out at temperatures greater than 650° C., carbon atoms may enter interstitial sites between silicon atoms (rather than being substituted for the silicon atoms) so as not to provide sufficient tensile stress to the channel region in the NMOS transistors.

Accordingly, in some embodiments according to the invention, the carbon doped epitaxial layers are formed in source/drain regions of the NMOS/PMOS transistors using selective epitaxial growth, so that carbon atoms are substituted for a maximum of about 2% of the silicon atoms in the carbon doped epitaxial layer so formed. In some embodiments according to the invention, the carbon doped epitaxial source/drain layers 165, 265 are elevated above an adjoining surface of the substrate, which may further increase the tensile stress on the channel to provide increased carrier mobility.

In other embodiments according to the invention, carbon doped source/drain regions can be provided by implanting carbon into the silicon substrate using the gate structures shown in FIG. 6 as an implant mask. Accordingly, the formation of the trenches 150, 250 and the subsequent growth of carbon doped epitaxial layers to provide the source/drain regions may be avoided.

Figure 9:
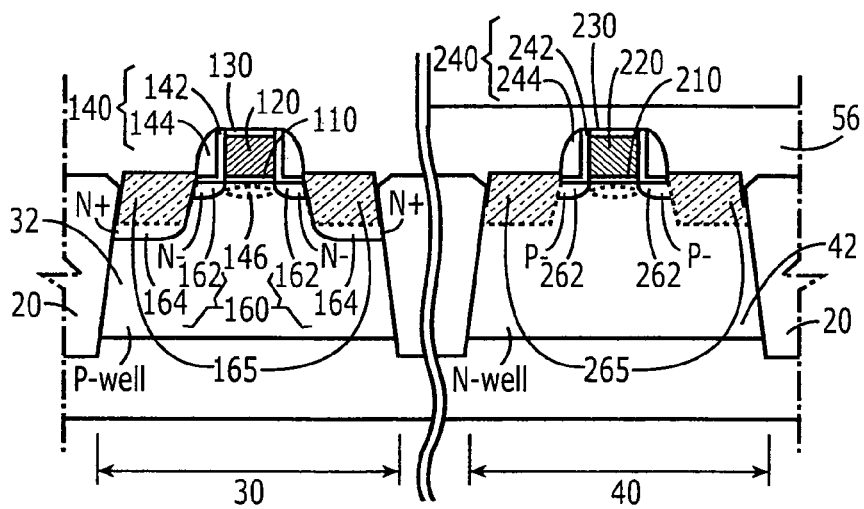

According to FIG. 9, a mask layer 56 is formed to cover the PMOS region 40 and to expose the NMOS region 30. An implant is performed using an N-type dopant to form N-type highly doped regions 164 in the source/drain regions of the NMOS transistors. In some embodiments according to the invention, As is used as the N-type dopant. Other types of dopants may be used. The mask layer 56 may then be removed.

Figure 10:
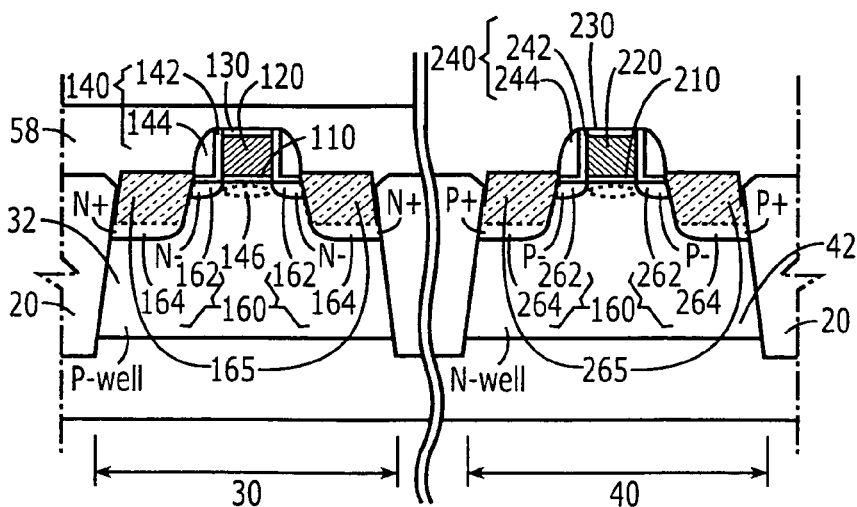

According to FIG. 10, a mask layer 58 is formed to cover the NMOS region 30 and to expose the PMOS region 40. An implant is performed using P-type dopants to form P-type highly doped source/drain regions 264 using the gate structures and sidewall spacers in the PMOS region 40 as an implant mask. In some embodiments according to the invention, B is used at the P-type dopant. However, other types of dopants may be used. The NMOS and PMOS regions 30, 40 are then thermally processed using a rapid thermal anneal or a laser annealing process. Other types of thermal treatment may also be used.

Figure 11:
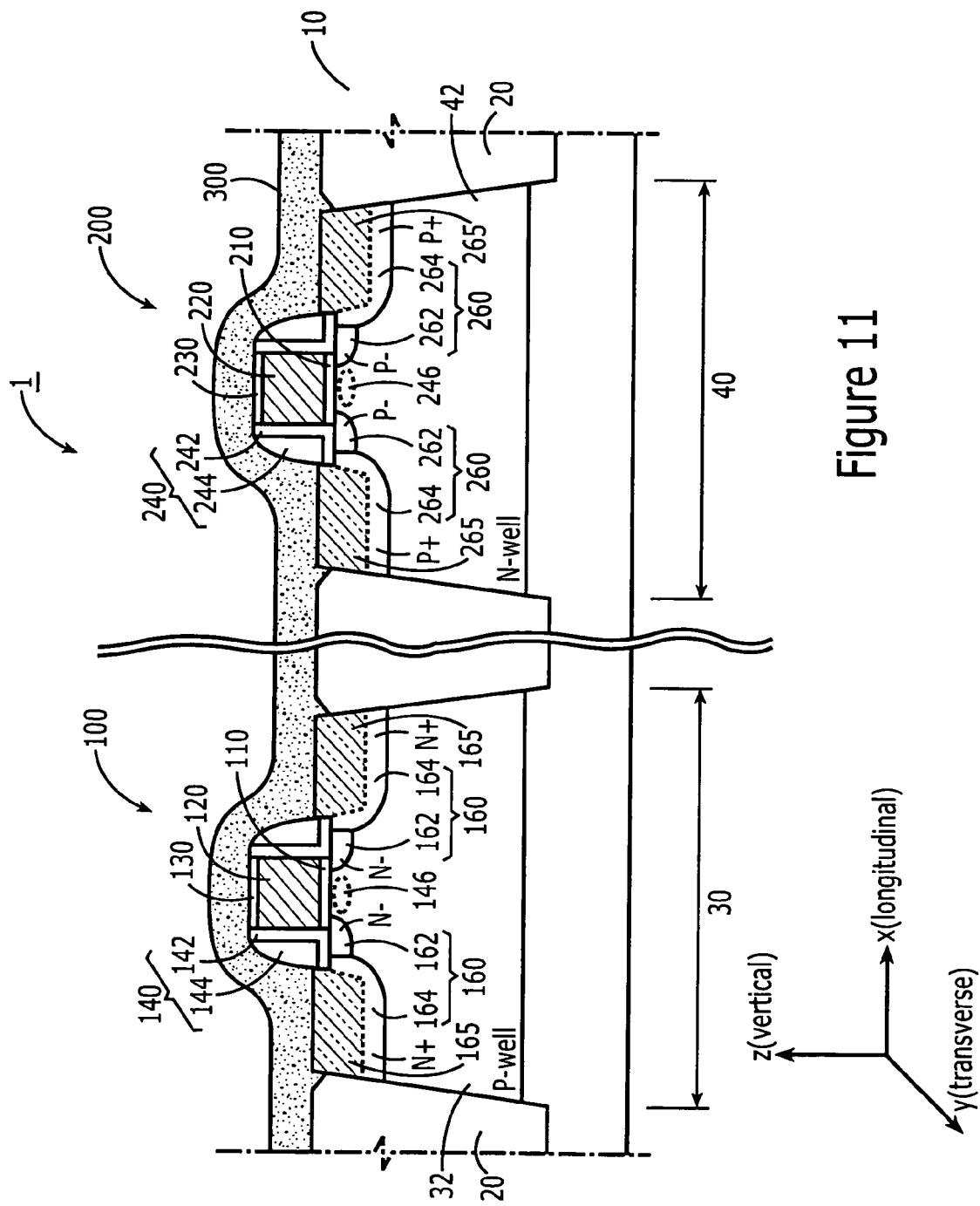

According to FIG. 11, a tensile layer 300 is formed over the NMOS and PMOS transistors included in the NMOS region 30 and PMOS region 40. In some embodiments according to the invention the tensile layer 300 can be formed of SiN, SiON, LPCVD oxide, ALD oxide or SOG oxide to have a thickness of about 50 Angstroms to about 2000 Angstroms to provide NMOS transistor structures 100 and PMOS transistor structures 200.

In some embodiments according to the invention, the tensile layer can be formed of SiN using a PECVD process employing SIH4 gas provided at a rate of about 10 to about 100 sccm with an NH3 gas at a rate of about 10 to about 100sccm and N2 at about 1 to about 5 SLM using an RE power of about 50 to about 1000 watts carried out at a temperature of about 400° C. to about 500° C.

Accordingly, the tensile layer 300 may be formed so that the ratio of N—H bonding to SI—H bonding within the SiN layer can be used to adjust the type of stress that the layer provides to the underlying NMOS/PMOS transistors. For example, in some embodiments according to the invention, the ratio of N—H bonding to SI—H bonding is about 1 to about 5 to provide a tensile stress to the channel located beneath the SiN layer. In other embodiments according to the invention, the ratio of N—H bonding to SI—H bonding can be about 5 to about 20 to provide a compressive stress in the corresponding channel. Therefore, in some embodiments according to the invention, the ratio of N—H bonding to SI—H bonding is adjusted to provide a ratio of about 1 to about 5 to provide a tensile stress to channels thereunder.

Figure 16:
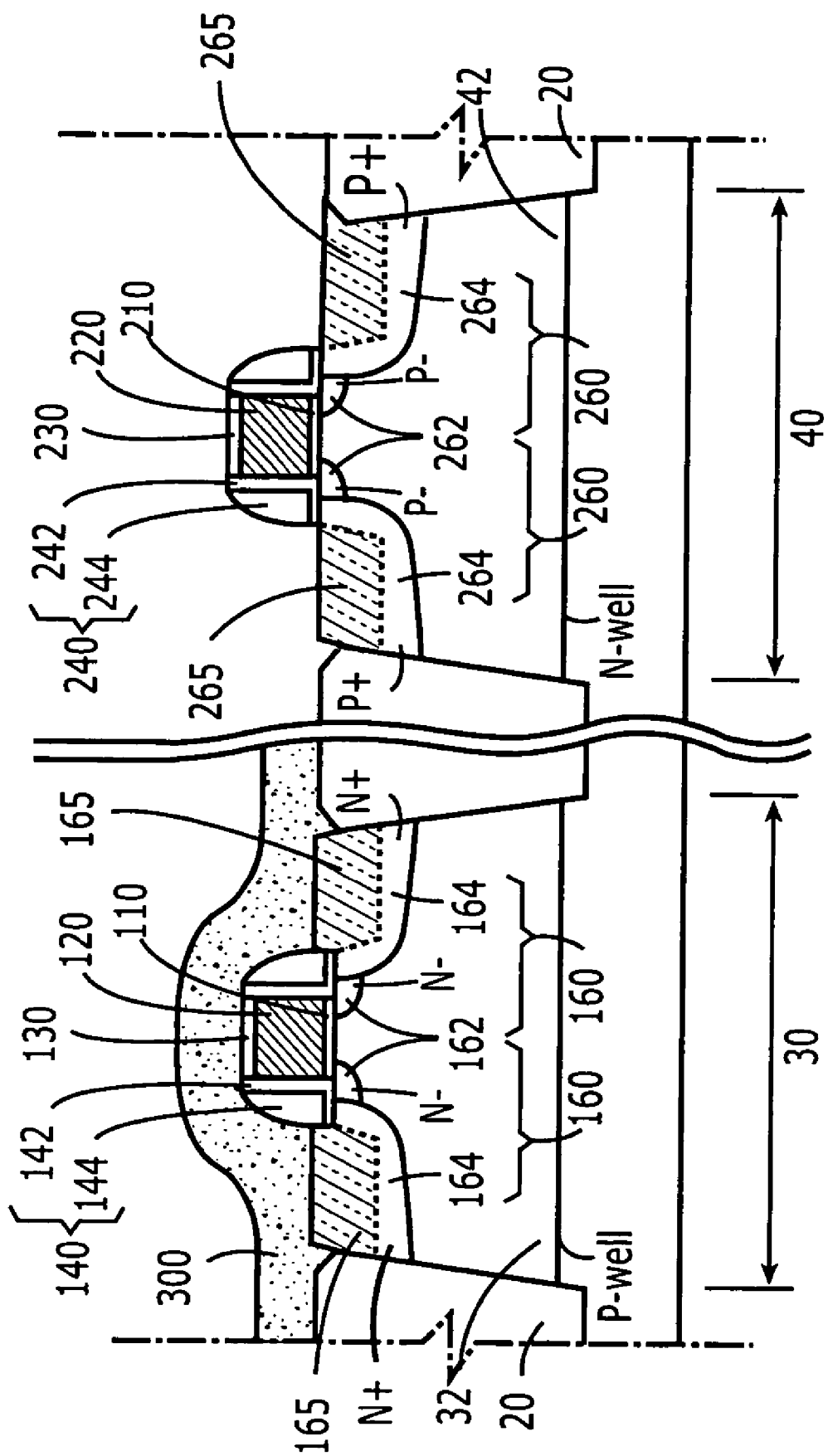
FIG. 16 is a cross sectional view that illustrates intermediate structures provided during formation of NMOS/PMOS transistors according to some embodiments of the invention.

In other embodiments according to the invention, the NMOS transistors in the NMOS region 30 can be formed as described above in reference to FIGS. 1-10 to provide the NMOS and PMOS transistors. However, the tensile layer 300 may be formed only on the NMOS transistors and not on the PMOS transistors to thereby avoid potential negative impact of the tensile layer 300 on the PMOS transistors, as illustrated in FIG. 16.

As described above, in some embodiments according to the invention, the orientation of the channels for the NMOS and PMOS transistors can be formed parallel to the <100> plane of the wafer to provide an increase in the current drive in the PMOS transistors. Furthermore, carbon doped source/drain regions of the NMOS and PMOS transistors are formed using selective epitaxial growth so as to improve the current drive of the associated NMOS transistors. In addition, a tensile layer may be formed over the NMOS and PMOS transistors to provide a further increase in drive current to the NMOS transistors thereunder. As appreciated by the present inventors, the use of the carbon doped epitaxial layers in the source/drain regions associated with the PMOS transistors as well as the tensile layer formed on the PMOS transistors may reduce the drive current of the PMOS transistors by about 1% to about 2%.

As further appreciated by the present inventors and as described above in reference to FIGS. 1-11, the carbon doped epitaxial layers used to form the source/drain regions of the NMOS transistors can improve the drive current thereof by about 20% to about 30%. Furthermore, the tensile layer formed on the NMOS transistors may also improve the drive current.

Figure 12:
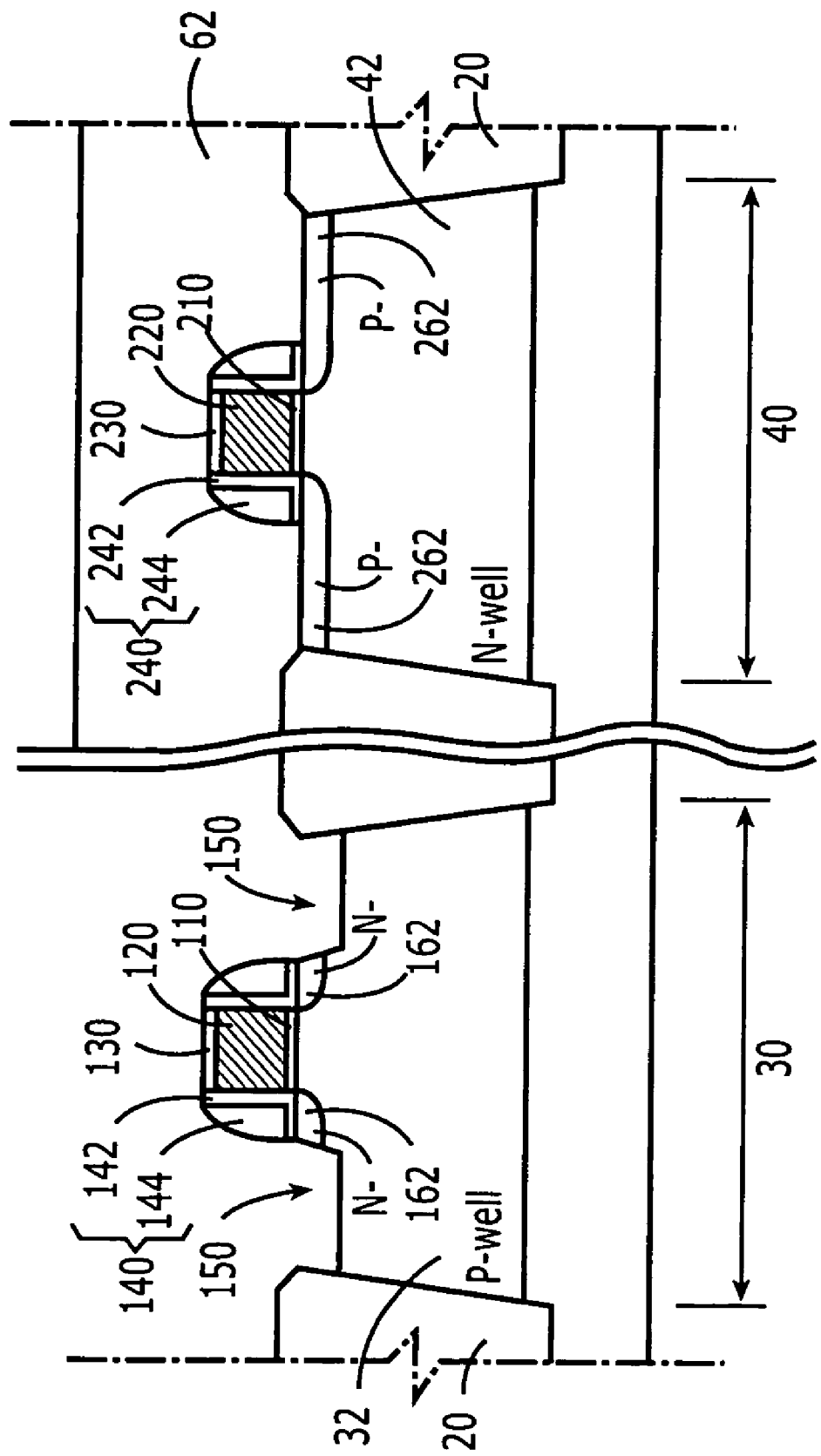
Figure 13:
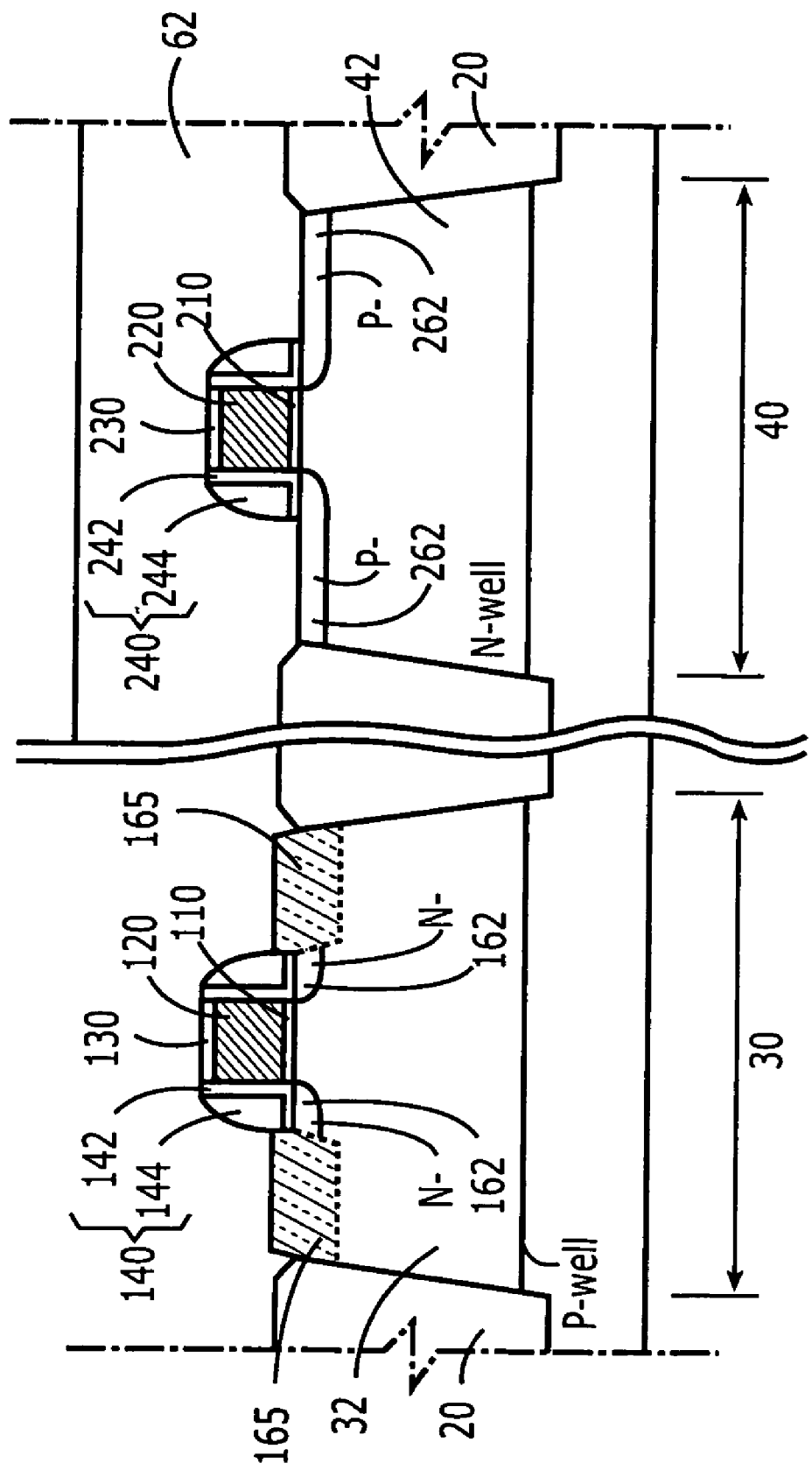
FIGS. 13-15 are cross sectional views that illustrate methods of forming NMOS/PMOS transistors according to some embodiments of the invention.
Figure 14:
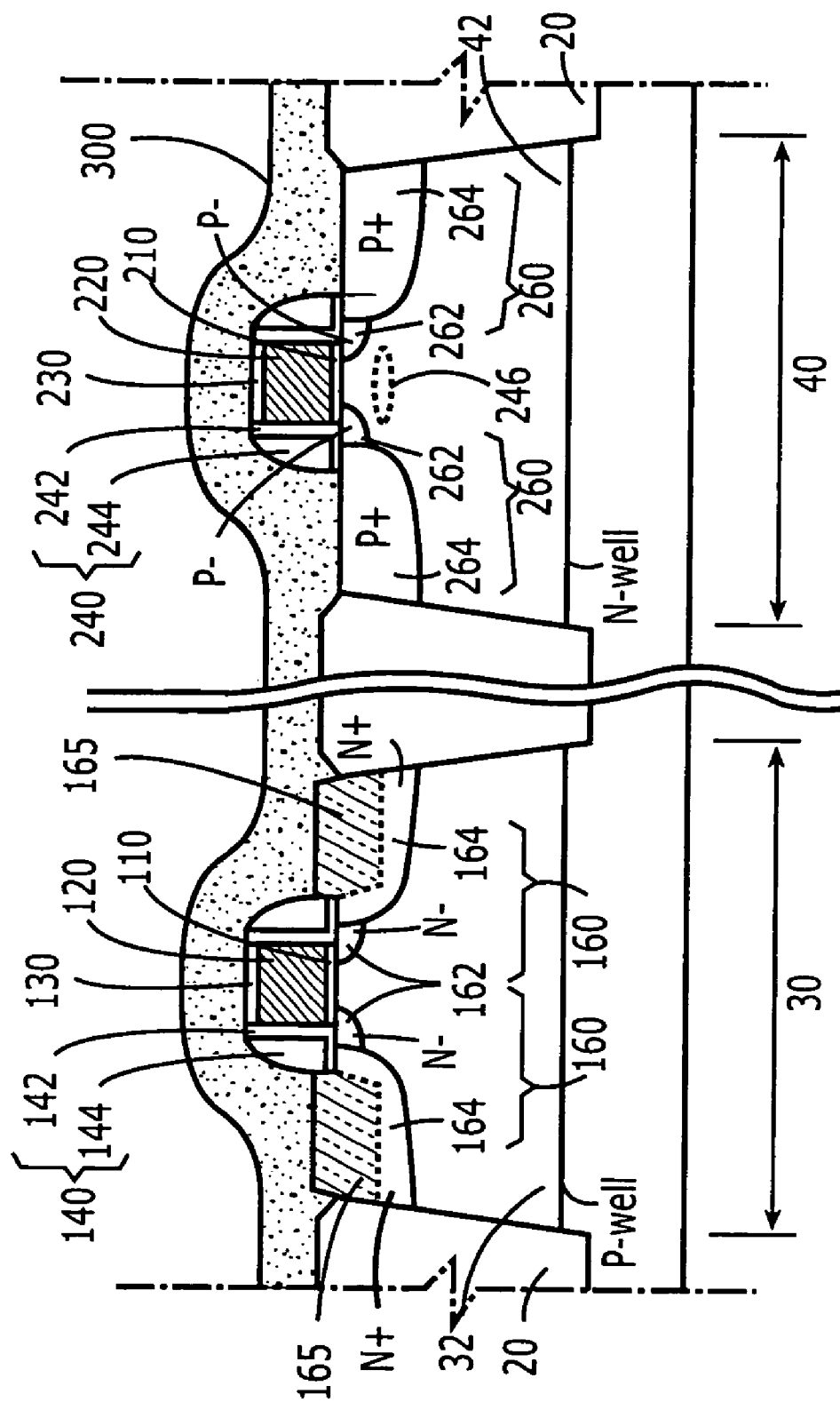

FIGS. 12-14 are cross sectional views that illustrate methods of forming NMOS/PMOS transistors according to some embodiments of the invention. In particular, as shown in FIG. 12, a mask 62 is formed to cover the PMOS regions 40 and expose the NMOS regions 30 to facilitate the formation of source/drain regions associated with the NMOS transistors. According to FIG. 12, the trench 150 is formed in the NMOS region 30 associated with NMOS transistors therein. As shown in FIG. 13, carbon doped epi-layer 165 is formed in the trench 150 to provide the source/drain regions for only the NMOS transistors. As shown in FIG. 14, highly doped N+ source/drain regions 164 are formed for the NMOS transistors and highly doped P+ source/drain regions 264 are formed for the PMOS transistors. In some embodiments according to the invention, the tensile stress layer 300 is formed over the NMOS and PMOS transistors, which may improve the drive current in the NMOS transistors.

Accordingly, as appreciated by the present inventors, avoiding the formation of carbon doped epitaxial source/drain regions in the PMOS transistors can help avoid a reduction in drive current in the PMOS transistors.

Figure 15:
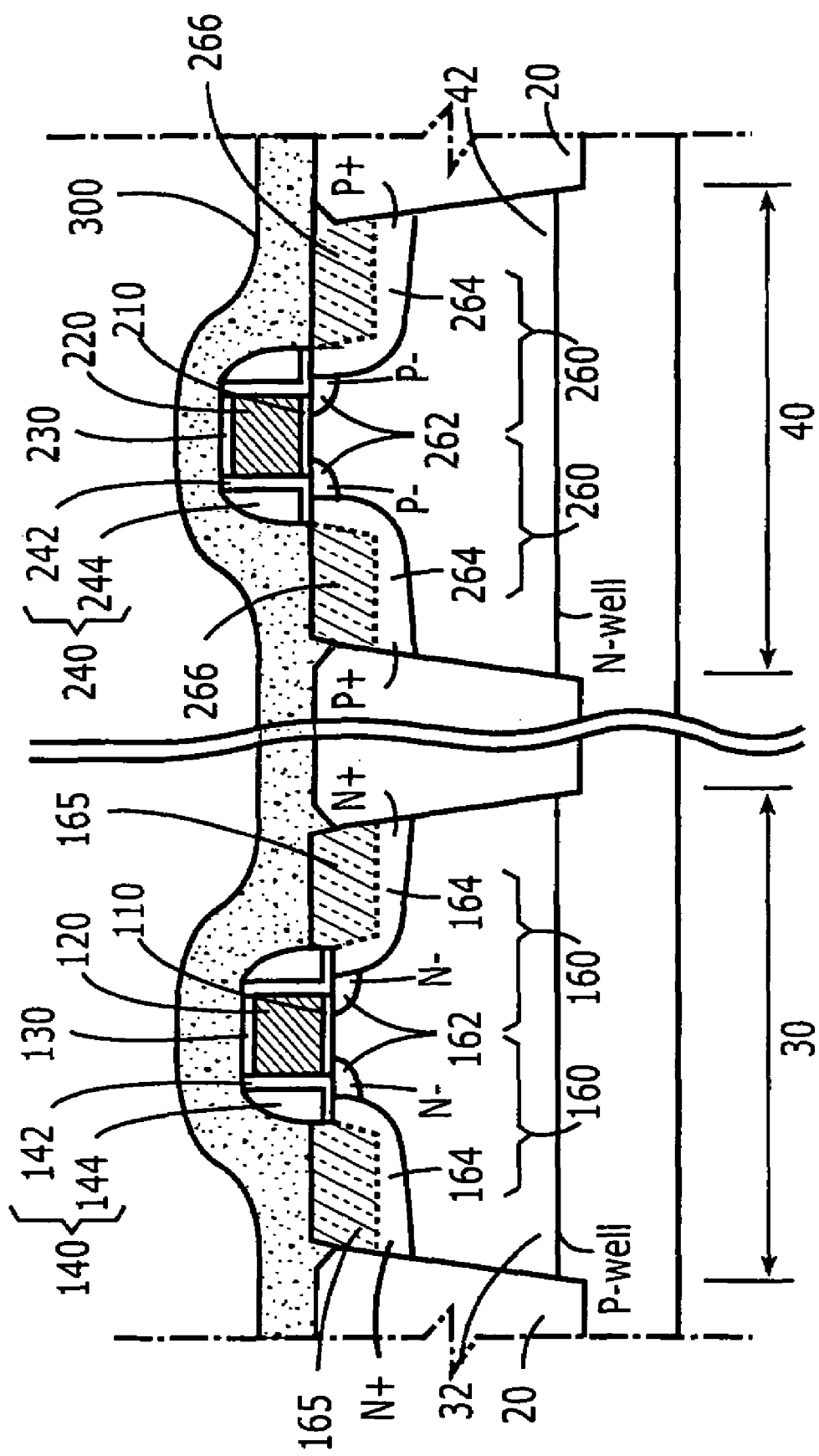

In still other embodiments according to the invention, germanium doped epitaxial layers 266 can be formed in the source/drain region of the PMOS transistors using selective epitaxial growth as illustrated in FIG. 15.

As appreciated by the present inventors, the formation of the germanium doped epitaxial source/drain regions 266 can allow the germanium atoms to be substituted for some of the silicon atoms to provide a compressive stress to a channel region 246 associated with the PMOS transistors. The compressive stress on the PMOS channels 246 can increase as the ratio of substituted germanium atoms substituted for silicon in the epi-layers is increased to further improve the drive current of the PMOS transistors.

Figure 17:
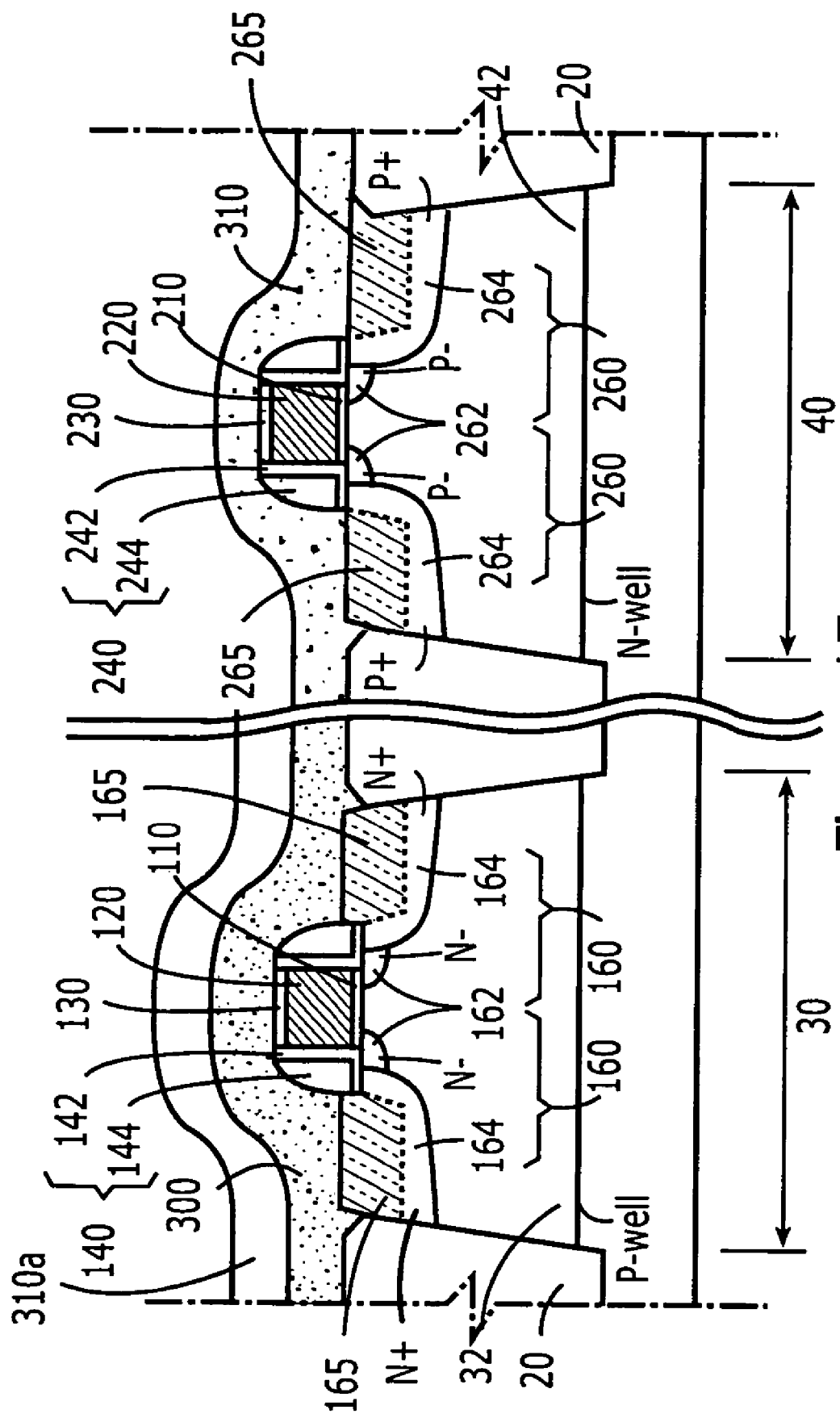
FIG. 17 is a cross sectional view that illustrates intermediate structures provided during formation of NMOS/PMOS transistors according to some embodiments of the invention.

In further embodiments according to the invention as illustrated in FIG. 17, a compressive layer can be formed on the PMOS transistors in the PMOS region 40. In particular, the tensile layer 300 may be removed from the PMOS region 40 and a compressive layer 310 formed on both the NMOS region 30 and the PMOS region 40. The compressive layer 310a in the NMOS region 30 can be treated to remove the compressive effect on the underlying NMOS transistors by, for example, implanting N or Ge impurities into the compressive layer 310a of the NMOS region 30, thereby tending to neutralize the stress on the NMOS transistors generated by the layer 310a. Further according to FIG. 17, the treatment of the compressive layer 310 may not be applied to the portion of the compressive layer 310 on the PMOS region 40 so that the compressive effects of the compressive layer 310 are maintained on the PMOS transistors thereunder in the PMOS region 40.

As described above, various approaches can be used in the formation of NMOS/PMOS transistors to promote the overall mobility of carriers therein. For example, in some embodiments according to the invention, PMOS and NMOS transistors are formed on a wafer so that active regions to be used as channels are aligned to the <100> plane of the wafer, which can improve the drive current of the PMOS transistor by about 10% to about 20%. Furthermore, carbon doped epi-layers can be used for the source/drains of the NMOS and PMOS transistors to allow an improvement in the drive current of the NMOS transistors by about 20% to about 30%, while also reducing the drive current of the PMOS transistors by about 1% to about 2%. Furthermore, a tensile layer can be formed on the NMOS and PMOS transistors to further improve the drive current of the NMOS transistor, while also reducing the drive current of the PMOS transistors. Therefore, as appreciated by the present inventors, the elements described above in the formation of NMOS and PMOS transistors can be combined for an overall drive current improvement by providing significant improvements in the performance of PMOS transistors (by the use of the <100> channel orientation) as well as the improvement of the drive current in the NMOS transistors by inclusion of the carbon doped epi-layers in the source/drain regions. Moreover, the negative impact of the carbon doped epi-source/drain regions and the tensile layer on the PMOS transistors can be small relative to the improvements for the NMOS transistors provided by the carbon doped epi-source drain regions, thereby providing an overall improvement in carrier mobility for devices including NMOS and PMOS transistors.

In the drawings and specification, there have been disclosed embodiments of the invention and, although specific terms are employed, they are used in a generic and descriptive sense only and not for purposes of limitation, the scope of the invention being set forth in the following claims.

What is claimed:

1. A method of forming an integrated circuit comprising:
    selectively forming active channel regions for NMOS and PMOS transistors on a substrate parallel to a <100> crystal orientation thereof; and
    selectively forming source/drain regions of the NMOS transistors with Carbon (C) impurities therein.

2. A method according to claim 1 further comprising:
    forming a tensile layer on the NMOS transistors to provide tensile strain in the active regions thereof.

3. A method according to claim 2 wherein forming a tensile layer comprises:
    forming a SiN layer on the NMOS transistors so that a ratio of N—H bonding to Si—H bonding in the SiN layer is about 1 to 5.

4. A method according to claim 3 wherein forming a SiN layer comprises:
    forming the SiN layer to a thickness of about 50 Angstroms to about 2000 Angstroms using SiH4 gas provided at a rate of about 1 to about 100 sccm with NH3 gas provided at a rate of about 10 to about 100 sccm with N2 gas provided at a rate of about 1 to about 5 slm at a power of about 50 to about 1000 W and a temperature of about 400 degrees Centigrade to about 500 degrees Centigrade.

5. A method according to claim 1 wherein selectively forming source/drain regions comprises:
    epitaxially growing C doped silicon in the source/drain regions to provide source/drain regions for the NMOS transistors to substitute C atoms for about 1% to about 2% of the Si atoms in the source/drain regions.

6. A method according to claim 1 wherein selectively forming source/drain regions comprises:
    implanting the source/drain regions of the NMOS transistors with C.

7. A method according to claim 5 wherein epitaxially growing comprises
    epitaxially growing the Carbon doped silicon in the source/drain regions using a CVD process at a temperature less than about 650 degrees Centigrade.

8. A method according to claim 7 wherein epitaxially growing the C doped silicon comprises epitaxially growing the C doped silicon in the source/drain regions using an RPCVD or UHVCVD process.

9. A method according to claim 7 wherein epitaxially growing the C doped silicon in the source/drain regions using an RPCVD process comprises:
    providing a Silicon gas at about 100 to about 200 sccm with C gas at about 5 to about 50 sccm with a selective etching gas at less than about 1000 sccm at a pressure of about 10 to about 20 Torr.

10. A method according to claim 2 wherein selectively forming source/drain regions of the NMOS transistors with C impurities therein further comprises:
    forming only the source/drain regions of the NMOS transistors with the carbon impurities therein.

11. A method according to claim 10 further comprising:
    forming the source/drain regions of the PMOS transistors with Germanium (Ge) impurities therein.

12. A method according to claim 2 wherein forming a tensile layer on the NMOS transistors further comprises:
    forming the tensile layer only on the NMOS transistors and avoiding forming the tensile layer on the PMOS transistors.

13. A method according to claim 2 wherein forming a tensile layer on the NMOS transistors comprises forming the tensile layer only on the NMOS transistors comprises, the method further comprising:
    forming a compressive strain layer only on the PMOS transistors.

14. A method of forming an integrated circuit comprising:
    selectively forming active channel regions for NMOS and PMOS transistors on a substrate parallel to a <100> crystal orientation thereof; and
    substituting Carbon (C) atoms for more than about 1% of Silicon (Si) atoms in source/drain regions of the NMOS transistors.

15. A method according to claim 14 further comprising:
    epitaxially growing Carbon (C) doped silicon in the source/drain regions to provide source/drain regions for the NMOS transistors to substitute C atoms for about 1% to about 2% of the Si atoms in the source/drain regions.

16. A method according to claim 14 wherein substituting C atoms comprises epitaxially growing Si with C impurities or implanting Si with C impurities.

17. A method of forming an integrated circuit comprising:
    selectively forming active channel regions for NMOS and PMOS transistors on a substrate parallel to a <100> crystal orientation thereof;
    selectively epitaxially growing Carbon (C) doped silicon in source/drain regions associated with the active channel regions of the NMOS and PMOS transistors; and
    forming a tensile layer on the NMOS and PMOS transistors.

18. A method according to claim 17 wherein forming a tensile layer comprises:
    forming a SiN layer so that a ratio of N—H bonding to Si—H bonding in the SiN layer is about 1 to 5.

19. A method according to claim 18 wherein forming a SiN layer comprises:

forming the SiN layer to a thickness of about 50 Angstroms to about 2000 Angstroms using SiH4 gas provided at a rate of about 10 to about 100 sccm with NH3 gas provided at a rate of about 1 to about 5 slm at a power of about 50 to about 1000 W and a temperature of about 400 degrees Centigrade to about 500 degrees Centigrade.

20. A method of forming an integrated circuit comprising:
selectively forming active channel regions for NMOS and PMOS transistors on a substrate parallel to a <100> crystal orientation thereof;
selectively epitaxially growing Carbon (C) doped silicon in source/drain regions associated only with the active channel regions of the NMOS transistors; and
forming a tensile layer on the NMOS and PMOS transistors.

21. A method of forming an integrated circuit comprising:
selectively forming active channel regions for NMOS and PMOS transistors on a substrate parallel to a <100> crystal orientation thereof;
selectively epitaxially growing Carbon (C) doped silicon in source/drain regions associated with the active channel regions of the NMOS transistors;
selectively epitaxially growing Germanium (Ge) doped silicon in source/drain regions associated with the active channel regions of the PMOS transistors; and
forming a tensile layer on the NMOS and PMOS transistors.

22. A method of forming an integrated circuit comprising:
selectively forming active channel regions for NMOS and PMOS transistors on a substrate parallel to a <100> crystal orientation thereof;
implanting Carbon (C) into source/drain regions associated with the active channel regions of the NMOS and PMOS transistors; and
forming a tensile layer on the NMOS and PMOS transistors.

23. A method of forming an integrated circuit comprising:
selectively forming active channel regions for NMOS and PMOS transistors on a substrate parallel to a <100> crystal orientation thereof;
selectively epitaxially growing Carbon (C) doped silicon in source/drain regions associated with the active channel regions of the NMOS and PMOS transistors; and
forming a tensile layer only on the NMOS transistors.

24. A method of forming an integrated circuit comprising:
selectively forming active channel regions for NMOS and PMOS transistors on a substrate parallel to a <100> crystal orientation thereof;
selectively epitaxially growing Carbon (C) doped silicon in source/drain regions associated with the active channel regions of the NMOS and PMOS transistors;
forming a tensile layer on the NMOS transistors; and
forming a compressive layer on the PMOS transistors.

25. A method according to claim 23 wherein forming a tensile layer on the NMOS transistor and forming a compressive layer on the PMOS transistors comprises:
forming the tensile layer on the NMOS and PMOS transistors;
removing the tensile layer from the PMOS transistors;
forming the compressive layer on the PMOS and NMOS transistors; and
implanting Nitrogen (N) or Germanium (Ge) into the compressive layer on the NMOS transistors.

26. A method according to claim 2 wherein forming a tensile layer on the NMOS transistors comprises forming the tensile layer only on the NMOS transistors, the method further comprising:
forming a compressive layer on the NMOS and the PMOS transistors; and
implanting Nitrogen (N) or Germanium (Ge) into the compressive layer on the NMOS transistors.

* * * * *